(12) United States Patent
Hayakawa et al.

(10) Patent No.: US 10,859,826 B2
(45) Date of Patent: Dec. 8, 2020

(54) HEAD-UP DISPLAY DEVICE

(71) Applicant: DENSO CORPORATION, Kariya (JP)

(72) Inventors: Yuichiro Hayakawa, Kariya (JP); Makoto Sakai, Kariya (JP); Takashi Takazawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/536,188

(22) Filed: Aug. 8, 2019

(65) Prior Publication Data

US 2019/0361234 A1   Nov. 28, 2019

Related U.S. Application Data

(63) Continuation of application No. PCT/JP2017/046329, filed on Dec. 25, 2017.

(30) Foreign Application Priority Data

Feb. 21, 2017   (JP) .................................. 2017-030198

(51) Int. Cl.
   *G02B 27/01*   (2006.01)
   *G09G 3/36*   (2006.01)
   *H01L 51/50*   (2006.01)

(52) U.S. Cl.
   CPC ..... *G02B 27/0101* (2013.01); *G02B 27/0149* (2013.01); *G02B 2027/0112* (2013.01); *G02B 2027/0187* (2013.01); *G09G 3/3607* (2013.01); *H01L 51/5012* (2013.01)

(58) Field of Classification Search
   CPC ...... G02B 27/0101–2027/0147; G09G 3/3607
   See application file for complete search history.

(56) References Cited

U.S. PATENT DOCUMENTS

| | | | |
|---|---|---|---|
| 2013/0242404 | A1 | 9/2013 | Kobayashi |
| 2013/0265646 | A1 | 10/2013 | Sakai |
| 2017/0235138 | A1 | 8/2017 | Morohashi et al. |
| 2018/0143431 | A1* | 5/2018 | Matsuura ........... G02B 27/0093 |
| 2018/0356641 | A1* | 12/2018 | Morohashi ......... G02B 27/0179 |

(Continued)

FOREIGN PATENT DOCUMENTS

| | | |
|---|---|---|
| JP | 2003237412 A | 8/2003 |
| JP | 2007264529 A | 10/2007 |

(Continued)

*Primary Examiner* — Michael Pervan
(74) *Attorney, Agent, or Firm* — Harness, Dickey & Pierce, P.L.C.

(57) ABSTRACT

A head-up display device displays a near virtual image and a far virtual image formed at different positions. The head-up display device includes an extension optical element, in addition to a first display surface that luminously displays a near display image and a second display surface that luminously displays a far display image. The extension optical element includes a reflective surface disposed on an optical path of light of the far display image. The extension optical element makes a far optical path distance of the far display image longer than a near optical path distance of the near display image by reflection of light by the reflective surface. The extension optical element has a transmission part that transmits light of the near display image in an area overlapping an optical path of light of the near display image.

17 Claims, 17 Drawing Sheets

(56) References Cited

U.S. PATENT DOCUMENTS

| | | | | |
|---|---|---|---|---|
| 2019/0086662 A1* | 3/2019 | Matsuzaki | ......... | G02B 27/0149 |
| 2019/0265582 A1* | 8/2019 | Sakai | ................... | G03B 21/142 |

FOREIGN PATENT DOCUMENTS

| JP | 2012179935 A | 9/2012 |
|---|---|---|
| JP | 2013214008 A | 10/2013 |
| JP | 2016045252 A | 4/2016 |

\* cited by examiner

FIG. 6
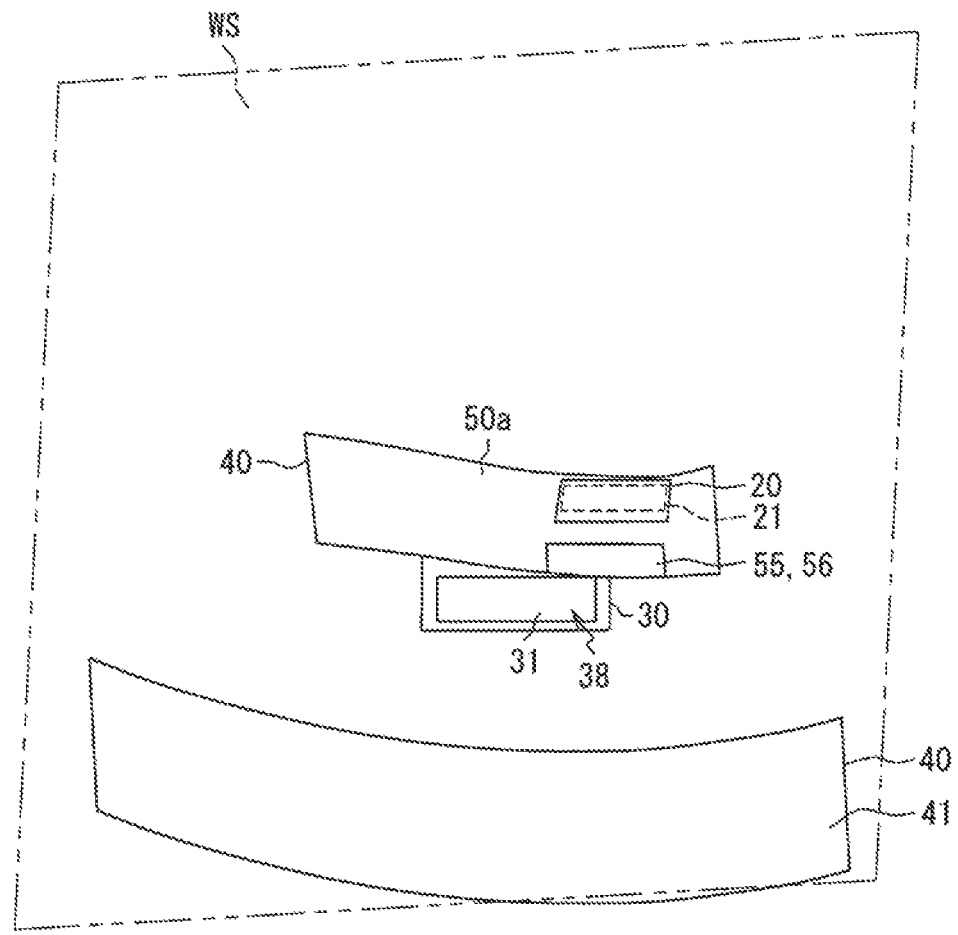
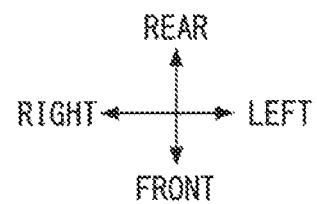

HEAD-UP DISPLAY DEVICE

CROSS REFERENCE TO RELATED APPLICATION

The present application is a continuation application of International Patent Application No. PCT/JP2017/046329 filed on Dec. 25, 2017, which designated the U.S. and claims the benefit of priority from Japanese Patent Application No. 2017-30198 filed on Feb. 21, 2017. The entire disclosures of all of the above applications are incorporated herein by reference.

TECHNICAL FIELD

The present disclosure relates to a head-up display device that displays a virtual image.

BACKGROUND ART

A head-up display device (hereinbelow, the "HUD device") projects a display image on, for example, a windshield of a vehicle to allow a viewer such as a driver to visually recognize a virtual image of the projected display image.

SUMMARY

According to an aspect of the present disclosure, a head-up display device that projects two display images on a projection member to display virtual images of the two display images formed at different positions visually recognizably by a viewer includes: a first display surface that luminously displays, among the two display images, a near display image to be formed as a near virtual image at a position closer to the projection member; a second display surface that luminously displays, among the two display images, a far display image to be formed as a far virtual image at a position farther from the projection member than the near virtual image is; and an extension optical element that includes a reflective surface disposed on an optical path of light of the far display image to reflect light of the far display image. The extension optical element makes a far optical path distance from the second display surface to the projection member longer than a near optical path distance from the first display surface to the projection member by reflection of light by the reflective surface. The extension optical element has a transmission part that transmits light of the near display image in an area overlapping an optical path of light of the near display image.

BRIEF DESCRIPTION OF DRAWINGS

FIG. 6 is a plan view illustrating the detailed positional relationship of the optical system of the HUD device.

DETAILED DESCRIPTION

Figure 1:
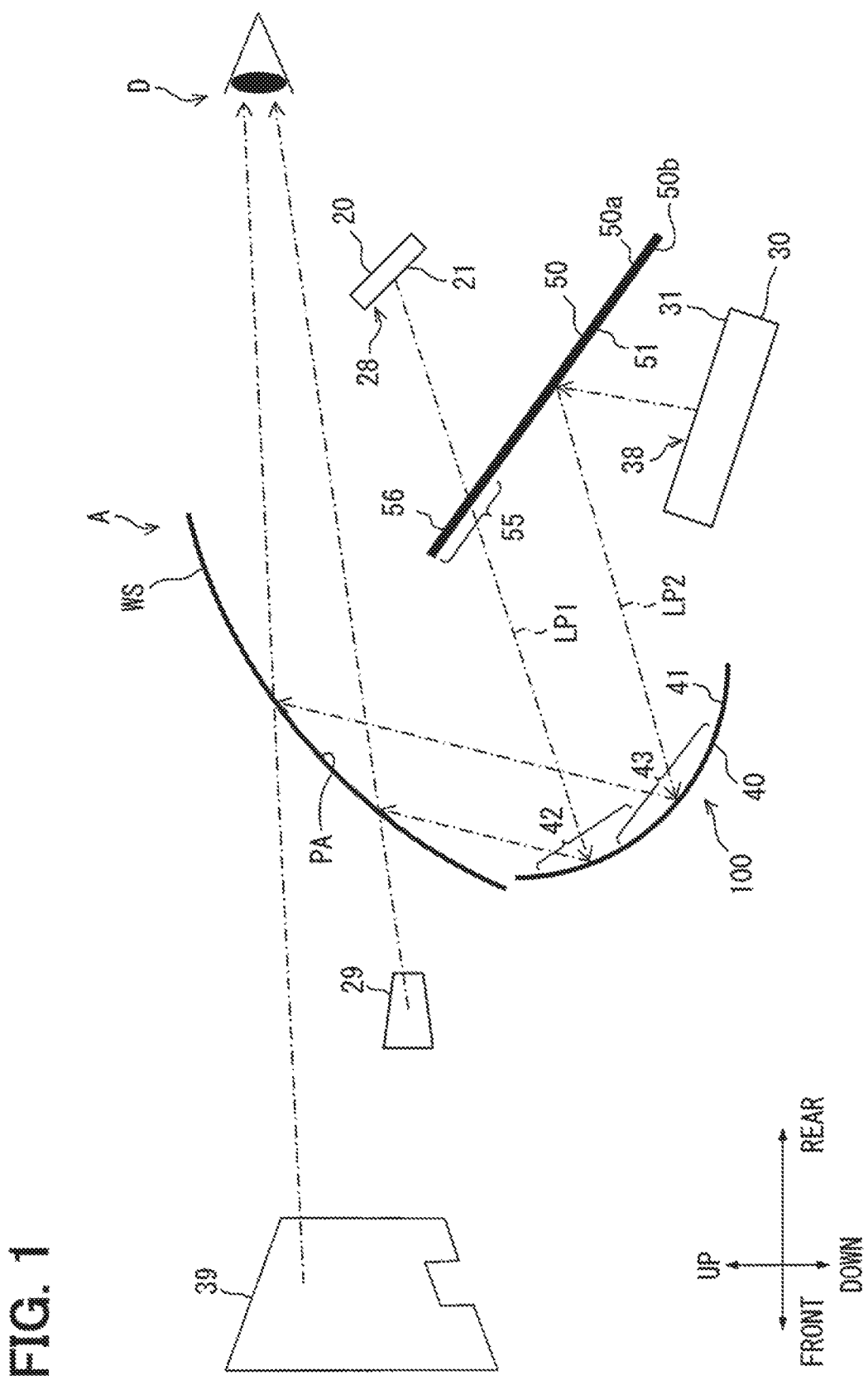
FIG. 1 is a diagram schematically illustrating the configuration of an HUD device according to a first embodiment.
Figure 2:
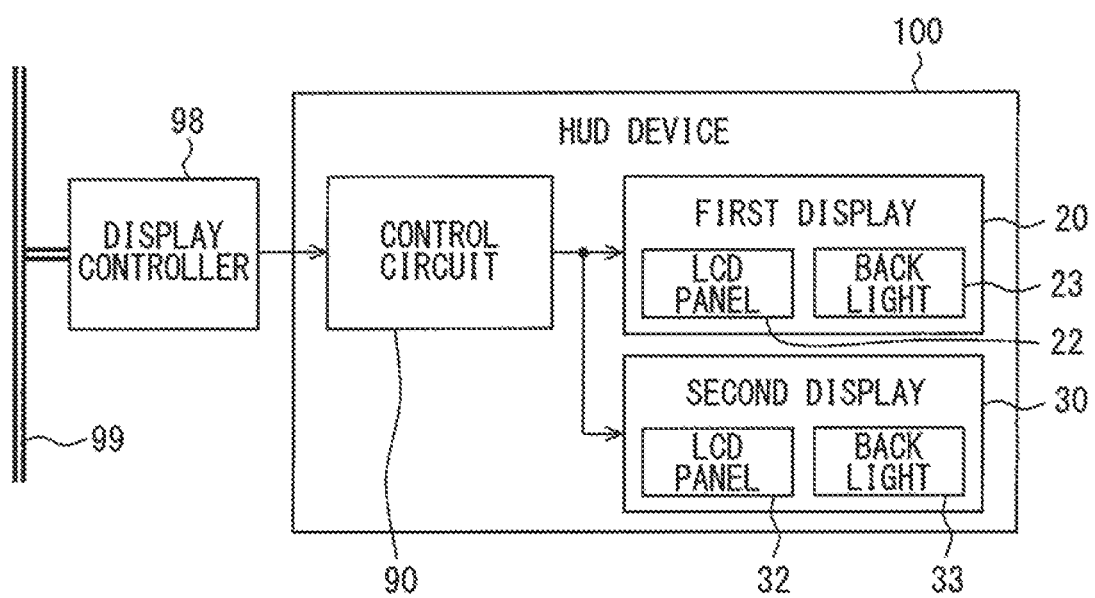
FIG. 2 is a block diagram illustrating the electrical configuration of the HUD device.

To begin with, examples of relevant techniques will be described.

A head-up display device (hereinbelow, the "HUD device") projects a display image on, for example, a windshield of a vehicle to allow a viewer such as a driver to visually recognize a virtual image of the projected display image. The HUD device may form virtual images of two display images at different positions.

Specifically, the HUD device is provided with a half mirror capable of both reflecting and transmitting light. Light of a virtual image formed near a windshield is reflected by the half mirror, and thereby projected on the windshield and the virtual image is formed in front of a viewer. On the other hand, light of a virtual image formed at a distant position is projected on the windshield after passing through the half mirror and the virtual image is formed in front of the viewer.

In the HUD device using the half mirror, optical paths of two beams of light formed as the respective virtual images overlap each other after passing through the half mirror. As a result, it is possible to form the virtual images at two different positions while preventing upsizing of the HUD device. However, the light reflectance and the light transmittance of a common half mirror are only approximately 50% each, and it is difficult to ensure high reflectance and high transmittance. As a result, approximately half of each light to be formed as a virtual image close to or far from a windshield is not projected on the windshield. As a result, it is difficult to ensure sufficient brightness of each virtual image.

The present disclosure provides an HUD device capable of ensuring sufficient brightness of each virtual image while preventing upsizing.

According to an aspect of the present disclosure, a head-up display device that projects two display images on a projection member to display virtual images of the two display images formed at different positions visually recognizably by a viewer includes: a first display surface that luminously displays, among the two display images, a near display image to be formed as a near virtual image at a position closer to the projection member; a second display surface that luminously displays, among the two display images, a far display image to be formed as a far virtual image at a position farther from the projection member than the near virtual image is; and an extension optical element that includes a reflective surface disposed on an optical path of light of the far display image to reflect light of the far display image. The extension optical element makes a far optical path distance from the second display surface to the projection member longer than a near optical path distance from the first display surface to the projection member by reflection of light by the reflective surface. The extension optical element has a transmission part that transmits light of the near display image in an area overlapping an optical path of light of the near display image.

According to the configuration of this mode in which the extension optical element is provided with the transmission part, it is possible to bring the optical paths of the two display images close to each other. Further, when the reflective surface and the transmission part are separately provided in the extension optical element, it is possible to ensure high reflectance of the reflective surface and also ensure high transmittance of the transmission part. According to the above configuration, the most part of light of each of the far display image and the near display image can be projected on the projection member.

According to an aspect of the present disclosure, a head-up display device that projects two display images on a projection member to display virtual images of the two display images formed at different positions visually recognizably by a viewer includes: a first display surface that luminously displays, among the two display images, a near display image to be formed as a near virtual image at a position closer to the projection member; a second display surface that luminously displays, among the two display images, a far display image to be formed as a far virtual image at a position farther from the projection member than the near virtual image is; and an extension optical element that includes a reflective surface disposed on an optical path of light of the far display image to reflect light of the far display image. The extension optical element makes a far optical path distance from the second display surface to the projection member longer than a near optical path distance from the first display surface to the projection member by reflection of light by the reflective surface. The extension optical element has a passage opening that allows light of the near display image to pass through.

The configuration of this mode in which the extension optical element is provided with the passage opening also makes it possible to bring the optical paths of the two display images close to each other. Further, when the reflective surface and the passage opening are separately provided in the extension optical element, it is possible to ensure high reflectance of the reflective surface. According to the above configuration, the most part of light of each of the far display image and the near display image can be projected on the projection member.

According to an aspect of the present disclosure, a head-up display device that projects two display images on a projection member to display virtual images of the two display images formed at different positions visually recognizably by a viewer includes: a first display surface that luminously displays, among the two display images, a near display image to be formed as a near virtual image at a position closer to the projection member; a second display surface that luminously displays, among the two display images, a far display image to be formed as a far virtual image at a position farther from the projection member than the near virtual image is; and an extension optical element that includes a reflective surface disposed on an optical path of light of the far display image to reflect light of the far display image. The extension optical element makes a far optical path distance from the second display surface to the projection member longer than a near optical path distance from the first display surface to the projection member by reflection of light by the reflective surface. The first display surface is integrally formed with the extension optical element and disposed side by side with the reflective surface.

The configuration of this mode in which the first display surface and the reflective surface are disposed side by side on the extension optical element also makes it possible to bring the optical paths of the two display images close to each other. Further, when the reflective surface is provided separately from the first display surface, it is easy to increase the reflectance of the reflective surface. In addition, the most part of light of each of the far display image and the near display image can be projected on the projection member.

Accordingly, the present disclosure provides an HUD device capable of ensuring sufficient brightness of each virtual image while preventing upsizing.

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

An HUD device 100 illustrated in FIG. 1 according to a first embodiment of the present disclosure is mounted on a vehicle A, and provides a driver D of the vehicle A with various pieces of information relating to the vehicle A. The HUD device 100 is disposed in front of a driver's seat on which the driver D is seated and housed in an instrument panel of the vehicle A.

The HUD device 100 projects beams of light of plural (two) display images on a projection area PA of a windshield WS. The light projected on the windshield WS is reflected by the projection area PA toward the driver D, and arrives at an eye box EB (refer to FIG. 9) which is previously defined so as to be located around the head of the driver D. The driver D whose eye point is located at the eye box EB can visually recognize the light of the display image as a virtual image superimposed on a foreground. The driver D can recognize various pieces of information by perceiving the virtual image. The virtually displayed various pieces of information include vehicle state information such as a vehicle speed and a remaining amount of fuel and navigation information such as a route guide.

The windshield WS is made of a light transmissive material such as glass and formed in a curved plate-like shape. The windshield WS is oriented to be inclined with respect to a horizontal direction and a vertical direction of the vehicle A. The windshield WS functions as one of optical systems for forming a virtual image. The projection area PA which is defined on a face of the windshield WS inside a cabin is curved in a concave shape with a curvature continuously changing in both the horizontal direction and the vertical direction in relation to a design of the vehicle A.

The projection area PA may be stuck to the windshield WS, for example, may be formed of an evaporated film or a film for increasing light reflectance. The projection member on which a virtual image is projected may be a combiner which is provided separately from the windshield WS.

The plural virtual images displayed by the HUD device 100 include a near virtual image 29 and a far virtual image 39. The near virtual image 29 and the far virtual image 39 are formed at different positions in the front-rear direction of the vehicle A. The near virtual image 29 is formed at a position closer to the windshield WS than the far virtual image 39 is, specifically, formed in a space approximately 2 to 3 meters ahead of the vehicle A from the eye point. The far virtual image 39 is formed at a position farther from the windshield WS than the near virtual image 29 is, specifically, formed in a space approximately 10 to 20 meters ahead of the vehicle A from the eye point. As an example, the near virtual image 29 is displayed approximately 2 m ahead of the eye point, and the far virtual image 39 is displayed approximately 15 m ahead of the eye point.

The image formation positions of the near virtual image 29 and the far virtual image 39 are separated also in the vertical (up-down) direction on visual recognition from the driver D. The image formation position of the near virtual image 29 is set slightly below the eye point. For example, a vehicle speed, an indicator, and an icon are displayed as the near virtual image 29. The image formation position of the far virtual image 39 is set at substantially the same height as the eye point. The far virtual image 39 is superimposed on, for example, a road surface on appearance for the driver D to function as augmented reality (AR) display. For example, an arrow giving a direction of a right turn or a left turn is displayed as the far virtual image 39.

A range in which the near virtual image 29 can be displayed has a horizontally-long rectangular shape. On the other hand, a range in which the far virtual image 39 can be displayed has a horizontally-long rectangular shape having a recessed cut-away part on the lower edge part thereof. In this manner, the range in which the far virtual image 39 can be displayed has a rectangular shape which is partially cut away so as to avoid the range in which the near virtual image 29 can be displayed on visual recognition from the driver D and defined in a shape surrounding three sides: the right side; the left side; and the upper side of the range in which the near virtual image 29 can be displayed. A size displayable as the far virtual image 39 is larger than a size displayable as the near virtual image 29.

Next, the configuration of the HUD device 100 will be described. The HUD device 100 is provided with, as components of an optical system for virtual image display, a first display device 20, a second display device 30, a control circuit 90, a magnifying optical element 40, and an extension optical element 50 illustrated in FIGS. 1 to 6. These components are housed in a housing of the HUD device 100 and held by the housing.

The first display device 20 is a display configuration that emits light of a near display image 28 formed as the near virtual image 29 toward the magnifying optical element 40. The first display device 20 includes a first display surface 21 which luminously displays the near display image 28. The first display device 20 is fixed to the housing of the HUD device 100 in a manner that the first display surface 21 faces the magnifying optical element 40 and that the first display surface 21 extends along the extension optical element 50.

The first display device 20 includes a liquid crystal display panel 22, a backlight 23, and others. The liquid crystal display panel 22 forms the first display surface 21. The first display surface 21 has a horizontally-long rectangular planar shape having substantially no curve. Many pixels are two-dimensionally arrayed on the first display surface 21. Each pixel includes red, green, and blue sub-pixels. The liquid crystal display panel 22 luminously displays various near display images 28 in color on the first display surface 21 by controlling the light transmittance of the sub-pixels.

The backlight 23 includes plural LEDs which radiate white light source light and a prism which guides the light radiated from each LED to the liquid crystal display panel 22. The light radiated from each LED is guided to the back face side of the first display surface 21 and transilluminates the near display image 28 rendered on the first display surface 21. Light of the near display image 28 that has passed through the first display surface 21 is projected on the magnifying optical element 40.

The first display device 20 is located behind the extension optical element 50 and above the second display device 30. The first display device 20 is disposed closer to the extension optical element 50 than the second display device 30 is. For example, the first display device 20 is disposed at a position where the entire first display surface 21 overlaps the extension optical element 50 in both side view and plan view in a state where the first display device 20 is mounted on the vehicle (refer to FIGS. 4 and 6). The longitudinal direction of the first display surface 21 corresponds to the longitudinal direction of the extension optical element 50. The center of the first display surface 21 is displaced from the center of the extension optical element 50 in both the longitudinal direction and the lateral direction of the extension optical element 50.

The second display device 30 is a display configuration that emits light of a far display image 38 formed as the far virtual image 39 toward the extension optical element 50. The second display device 30 includes a second display surface 31 which luminously displays the far display image 38. The second display device 30 is fixed to the housing of the HUD device 100 in a manner that the second display surface 31 faces the extension optical element 50.

The second display device 30 includes a liquid crystal display panel 32 and a backlight 33 as with the first display device 20. The liquid crystal display panel 32 forms the second display surface 31. The second display surface 31 has a horizontally-long rectangular planar shape having substantially no curve as with the first display surface 21. The area of the second display surface 31 is larger than the area of the first display surface 21 (refer to FIG. 5 and the like). Many pixels are two-dimensionally arrayed on the second display surface 31. The liquid crystal display panel 32 individually controls the light transmittance of plural sub-pixels constituting each pixel to luminously display various far display images 38 in color on the second display surface 31.

The backlight 33 has substantially the same configuration as the backlight 23. Light radiated from each LED of the backlight 33 is guided to the back face side of the second display surface 31 and transilluminates the far display image 38 rendered on the second display surface 31. Light of the far display image 38 that has passed through the second display surface 31 is reflected by the extension optical element 50 and projected on the magnifying optical element 40.

The second display device 30 is located between the magnifying optical element 40 and the extension optical element 50 in the front-rear direction of the vehicle A. The second display device 30 is disposed below the extension optical element 50. The second display device 30 is disposed closer to the magnifying optical element 40 than the extension optical element 50 is. The longitudinal direction of the second display surface 31 corresponds to the longitudinal direction of the extension optical element 50. The center in the longitudinal direction of the second display surface 31 substantially corresponds to the center in the longitudinal direction of the extension optical element 50.

The control circuit 90 controls display of the near virtual image 29 and the far virtual image 39 by the HUD device 100. The control circuit 90 mainly includes a microcontroller including a processor, a RAM, and a storage medium. The control circuit 90 is electrically connected to a display controller 98 which is mounted on the vehicle A, and the first display device 20 and the second display device 30. The display controller 98 acquires information of the vehicle A through a communication bus 99 which is mounted on the vehicle A and determines a display mode of the near virtual image 29 and the far virtual image 39 corresponding to the condition. The control circuit 90 controls the first display device 20 and the second display device 30 in accordance with a command signal from the display controller 98 to provide the driver D with information necessary for the driver D through the near virtual image 29 and the far virtual image 39.

The magnifying optical element 40 is a reflecting mirror which includes a colorless and transparent base made of synthetic resin or glass and metal such as aluminum deposited on the surface of the base. The magnifying optical element 40 is formed in a horizontally-long rectangular plate-like shape as a whole. The magnifying optical element 40 is curved so that the aluminum-deposited surface has a concave shape. The magnifying optical element 40 is disposed below the projection area PA and forward of the extension optical element 50. A magnifying reflective surface 41 is formed on the magnifying optical element 40. The magnifying optical element 40 is held by the housing of the HUD device 100 in a manner that the magnifying reflective surface 41 faces the first display device 20 and the extension optical element 50.

The magnifying reflective surface 41 has a horizontally-long rectangular shape curved in a wave-like form in the thickness direction of the magnifying optical element 40. The magnifying reflective surface 41 is formed in a concave free-form surface having different curvatures in the longitudinal direction and the lateral direction. The curvature defined in each direction of the magnifying reflective surface 41 does not have to be constant and may vary in each position of the magnifying reflective surface 41. The magnifying reflective surface 41 is disposed across both an optical path of light of the near display image 28 (hereinbelow, the "near light image optical path LP1") and an optical path of light of the far display image 38 (hereinbelow, the "far light image optical path LP2"). Light of the near display image 28 emitted from the first display surface 21 and light of the far display image 38 reflected by the extension optical element 50 both enter the magnifying reflective surface 41. In the magnifying reflective surface 41, at least a part of a first incident area 42 where light of the near display image 28 enters overlaps at least a part of a second incident area 43 where light of the far display image 38 enters. The first incident area 42 is located above the second incident area 43. The second incident area 43 is wider than the first incident area 42. The center in the longitudinal direction of the magnifying reflective surface 41 substantially corresponds to the center in the longitudinal direction of the extension optical element 50.

The magnifying optical element 40 reflects light of the far display image 38 and the far virtual image 39 toward the upper side, namely, toward the windshield WS while spreading the light by the magnifying reflective surface 41 curved in a concave shape. The near virtual image 29 magnified from the near display image 28 and the far virtual image 39 magnified from the far display image 38 are formed by the reflection on the magnifying reflective surface 41. The magnification of the far virtual image 39 with respect to the far display image 38 is larger than the magnification of the near virtual image 29 with respect to the near display image 28.

The extension optical element 50 is a reflecting mirror which includes a colorless and transparent base made of synthetic resin or glass and metal such as aluminum deposited on the surface of the base as with the magnifying optical element 40. The extension optical element 50 is formed, as a whole, in a rectangular plate-like shape smaller than the extension optical element 50. The extension optical element 50 is curved so that the aluminum-deposited surface has a convex shape. The extension optical element 50 is located behind the magnifying optical element 40 and forward of the first display device 20. The extension optical element 50 is located between the magnifying optical element 40 and the first display device 20 and disposed closer to the first display device 20 than the magnifying optical element 40 is.

The extension optical element 50 is disposed on the far light image optical path LP2, specifically, in a section from the second display surface 31 to the magnifying reflective surface 41 on the far light image optical path LP2. In addition, at least a part of the extension optical element 50 also overlaps the near light image optical path LP1. An extension reflective surface 51 and a transmission part 55 are formed on the extension optical element 50. The extension optical element 50 is held by the housing of the HUD device 100 in a manner that the extension reflective surface 51 faces the magnifying reflective surface 41 and the second display surface 31. In the following description, in both faces of the extension optical element 50, one face on which the extension reflective surface 51 is formed is referred to as a front face 50b, and the other face where light of the near display image 28 enters is referred to as a back face 50a.

The extension reflective surface 51 has a horizontally-long rectangular shape curved in a wave-like form in the thickness direction of the extension optical element 50. The extension reflective surface 51 is formed in a concave free-form surface having different curvatures in the longitudinal direction and the lateral direction. The curvature defined in each direction of the extension reflective surface 51 does not have to be constant and may vary in each position of the extension reflective surface 51. Light of the far display image 38 emitted from the second display surface 31 enters the extension reflective surface 51. The extension reflective surface 51 reflects light of the far display image 38 emitted from the second display surface 31 toward the front side, namely, toward the magnifying optical element 40. The extension reflective surface 51 makes a far optical path distance from the second display surface 31 to the projection area PA longer than a near optical path distance from the first display surface 21 to the projection area PA by an optical function of turning the far light image optical path LP2 back. A virtual optical axis line of the far light image optical path LP2 between the extension reflective surface 51 and the second incident area 43 extends substantially along a virtual optical axis line of the near light image optical path LP1 between the first display surface 21 and the first incident area 42. Strictly speaking, the optical axis line of the far light image optical path LP2 is gradually separated from the optical axis line of the near light image optical path LP1 as approaching the second incident area 43.

The transmission part 55 is formed in a part overlapping the near light image optical path LP1 in the extension optical element 50. The transmission part 55 transmits light of the near display image 28. The transmission part 55 is formed in a range facing the first display surface 21 in the extension optical element 50. Metal such as aluminum forming the extension reflective surface 51 is deposited on the extension optical element 50 avoiding an area to be the transmission part 55. The transmission part 55 is formed in a horizontally-long rectangular shape as with the first display surface 21. The area of the transmission part 55 is larger than the area of the first display surface 21 so as not to block light of the near display image 28 which travels while spreading from the first display surface 21. In order to reduce the area of the transmission part 55, the distance between the transmission part 55 and the first display surface 21 is desirably short, and set to, for example, 40 mm or less, specifically, set to approximately 25 mm. The transmission part 55 is formed continuously with the extension reflective surface 51 on the front face 50b. The extension reflective surface 51 borders on at least a range of half or more of the peripheral edge of the transmission part 55. Specifically, a long side and two short sides of the transmission part 55 border on the extension reflective surface 51.

The transmission part 55 includes a coat layer 56 which is disposed on the back face 50a facing the first display surface 21. The coat layer 56 is formed of, for example, a wavelength selective filter. The coat layer 56 has a function of mainly transmitting light in the visible range and blocking light in the near infrared range. The coat layer 56 transmits the most part (e.g., approximately 90%) of light of the near display image 28 emitted from the first display surface 21. On the other hand, the coat layer 56 reflects the most part of near infrared light included in sunlight (external light) that enters the inside of the HUD device 100 and arrives at the transmission part 55 from the magnifying reflective surface 41. The transmittance of light in the near infrared range in the transmission part 55 is defined lower than the transmittance of light in the visible range in the transmission part 55 by the above function of the coat layer 56. As an example, light having a wavelength of 380 nm to 780 nm is defined as light in the visible range, and light having a wavelength of 780 nm to 1080 nm is defined as light in the near infrared range.

In the HUD device 100 described above, the windshield WS is used as the optical system which forms each of the virtual images 29, 39. However, the windshield WS is not curved with an optically preferred curvature. Thus, the reflection in the projection area PA has an optical influence on the near virtual image 29 and the far virtual image 39. Thus, the optical elements included in the HUD device 100, that is, the magnifying optical element 40 and the extension optical element 50 are designed so as to correct the optical influence caused by the reflection on the windshield WS.

Specifically, the magnifying reflective surface 41 is set to a curved shape preferred for correction of the optical influence on the near display image 28. When the distance to the image formation position is relatively short and the magnification is small (e.g., less than 10 times), there is less influence of the shape of the windshield WS. Thus, an image formation performance of the near virtual image 29 can be sufficiently ensured only by correction by the magnifying reflective surface 41.

On the other hand, when the distance to the image formation position is relatively long (e.g., 5 m or more) in order to perform AR display and the magnification is also large (e.g., 10 times or more), the influence of the shape of the windshield WS is likely to become apparent. Thus, the optical influence on the far display image 38 is corrected by both the magnifying reflective surface 41 and the extension reflective surface 51. Specifically, the extension reflective surface 51 is set to a curved shape preferred for performing a correction that cannot be performed by the magnifying reflective surface 41 in the optical influence on the far display image 38. As a result, light of the far display image 38 is clearly formed as the far virtual image 39 by passing through the extension reflective surface 51 and the magnifying reflective surface 41 in order even when the light is reflected by the projection area PA.

The optical influence includes, for example, field curvature and astigmatism. The field curvature is a phenomenon in which a display image displayed in a planar shape is curved in the front-rear direction along the optical axis by the concave shape of the projection area PA. The astigmatism is a phenomenon in which individual point images constituting a virtual image are deformed by an inconsistency in focal length at each position in the projection area PA.

According to the configuration as described in the first embodiment in which the extension optical element 50 disposed on the far light image optical path LP2 is provided with the transmission part 55 which transmits light of the near display image 28, it is possible to bring the near light image optical path LP1 and the far light image optical path LP2 close to each other. In addition, when the extension reflective surface 51 and the transmission part 55 are separately provided in the extension optical element 50, high reflectance of the extension reflective surface 51 can be ensured and high transmittance of the transmission part 55 can also be ensured as compared to a configuration in which the entire extension optical element 50 is formed of a half mirror. Thus, the most part of light of the far display image 38 and the most part of light of the near display image 28 can be projected on the projection area PA. The above configuration achieves the HUD device 100 capable of ensuring sufficient brightness of each of the virtual images 29, 39 while preventing upsizing. When the image formation can be performed without losing the amount of light of each of the near display image 28 and the far display image 38, it is possible to increase the visual recognizability of the near virtual image 29 and the far virtual image 39.

In addition, in the extension optical element 50 of the first embodiment, the most part of the outer edge of the transmission part 55 borders on the extension reflective surface 51. In such disposition in which the transmission part 55 and the extension reflective surface 51 are closely disposed, even when the transmission part 55 and the transmission part 55 are separately provided, the near virtual image 29 and the far virtual image 39 can be displayed at positions close to each other on visual recognition of the driver D. The above configuration makes it easy to expand areas in which the near virtual image 29 and the far virtual image 39 can be displayed. Thus, high flexibility of virtual image display can be ensured.

Further, in the first embodiment, the coat layer 56 is formed on the transmission part 55 to reduce the transmittance of light in the near infrared range in the transmission part 55. With such a configuration, it is possible to protect the first display surface 21 from sunlight that enters the HUD device 100.

Further, the extension optical element 50 of the first embodiment is disposed closer to the first display surface 21 than the magnifying optical element 40 is. In such a positional relationship, the transmission part 55 transmits light of the near display image 28 emitted from the first display surface 21 before the light of the near display image 28 largely spreads. Accordingly, the size of the transmission part 55 can be reduced. Thus, upsizing of the HUD device 100 can be more reliably prevented.

In addition, in the magnifying reflective surface 41 of the first embodiment, the first incident area 42 and the second incident area 43 overlap each other. Such a design of the optical system enables downsizing of the magnifying optical element 40. In addition, since the optical influence on the far virtual image 39 is corrected not only by the magnifying reflective surface 41, but also by the extension reflective surface 51, even when the first incident area 42 and the second incident area 43 partially overlap each other, sufficient image formation performance of the two virtual images 29, 39 can be ensured.

In the first embodiment, the extension reflective surface 51 corresponds to the "reflective surface", the vehicle A corresponds to a "moving body", the driver D corresponds to the "viewer", and the windshield WS corresponds to the "projection member".

Second Embodiment

Figure 7:
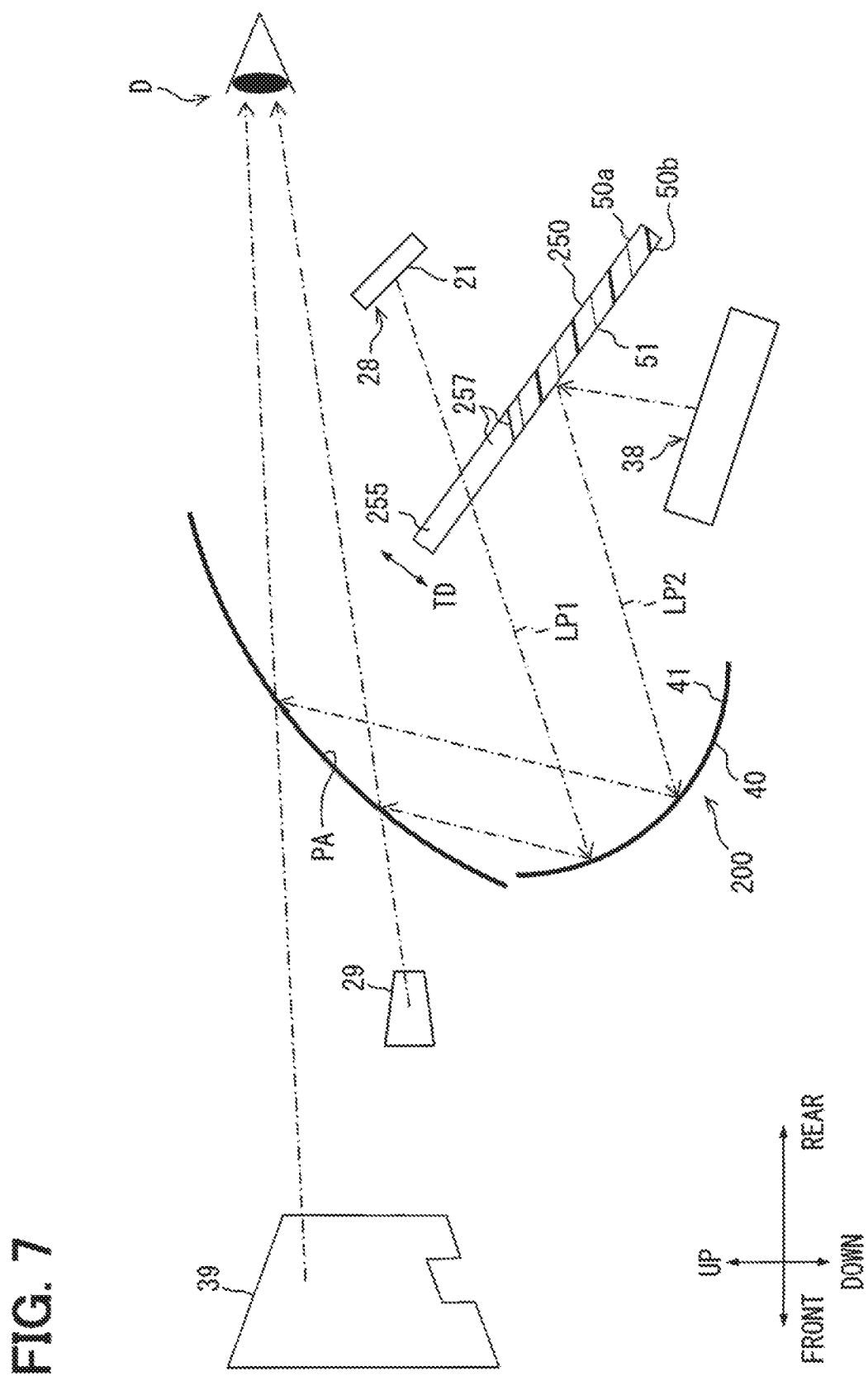
FIG. 7 is a diagram schematically illustrating an HUD device according to a second embodiment.
Figure 8:
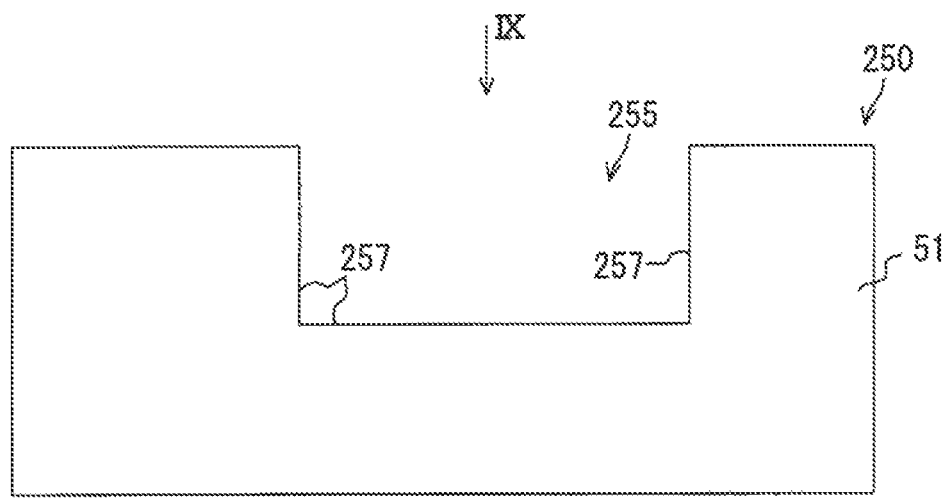
FIG. 8 is a diagram illustrating the shape of an extension optical element of the second embodiment.
Figure 9:
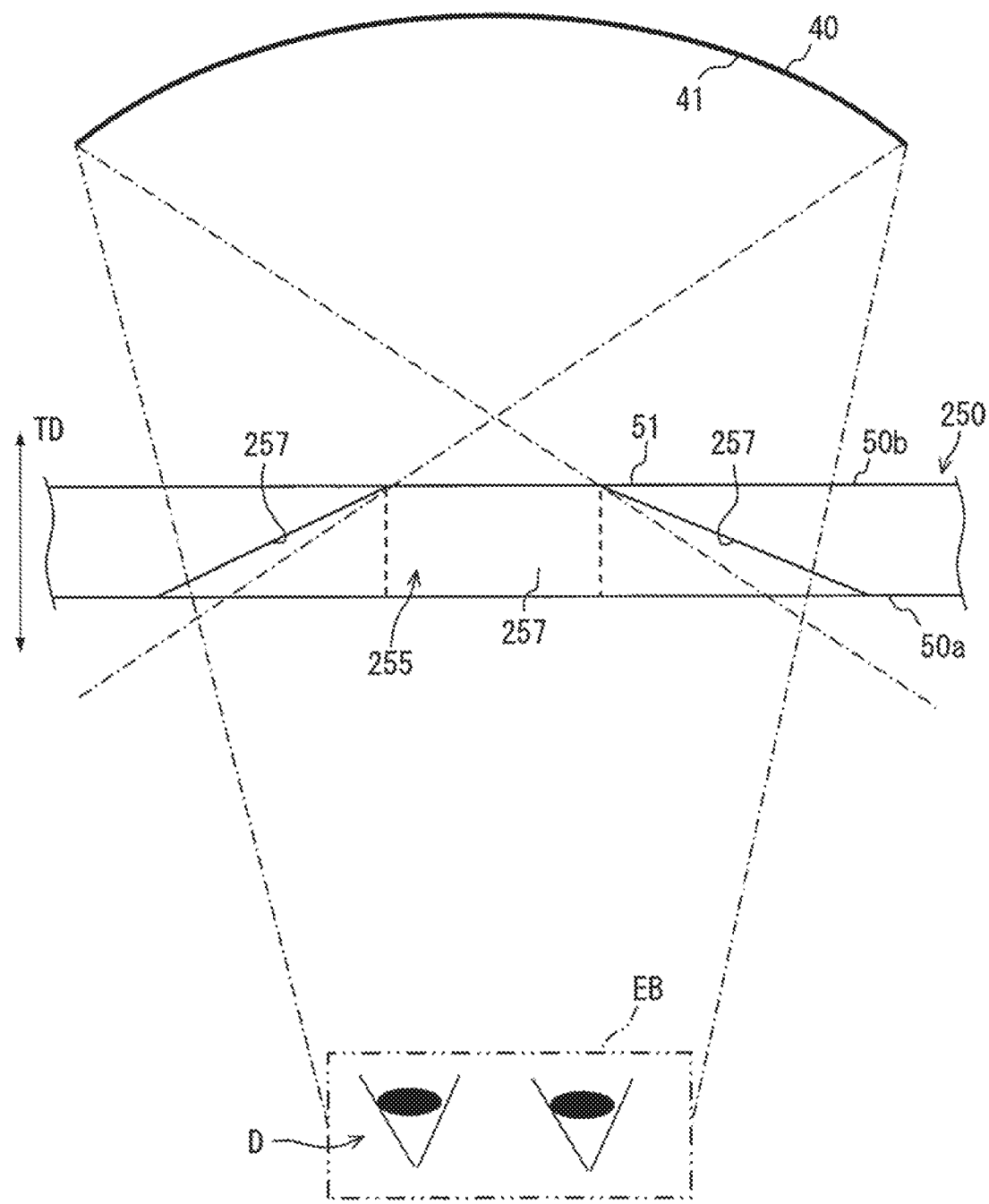
FIG. 9 is a diagram illustrating the extension optical element viewed in the direction of arrow IX of FIG. 8 and illustrating an inclination of an end face which defines a passage opening in an exaggerated manner.

A second embodiment of the present disclosure illustrated in FIGS. 7 to 9 is a modification of the first embodiment. An HUD device 200 according to the second embodiment is provided with an extension optical element 250. The extension optical element 250 is an odd-form mirror and formed in a horizontally-long rectangular shape which is partially cut away. The extension optical element 250 includes a passage opening 255 in addition to an extension reflective surface 51 which is substantially the same as the first embodiment.

Figure 3:
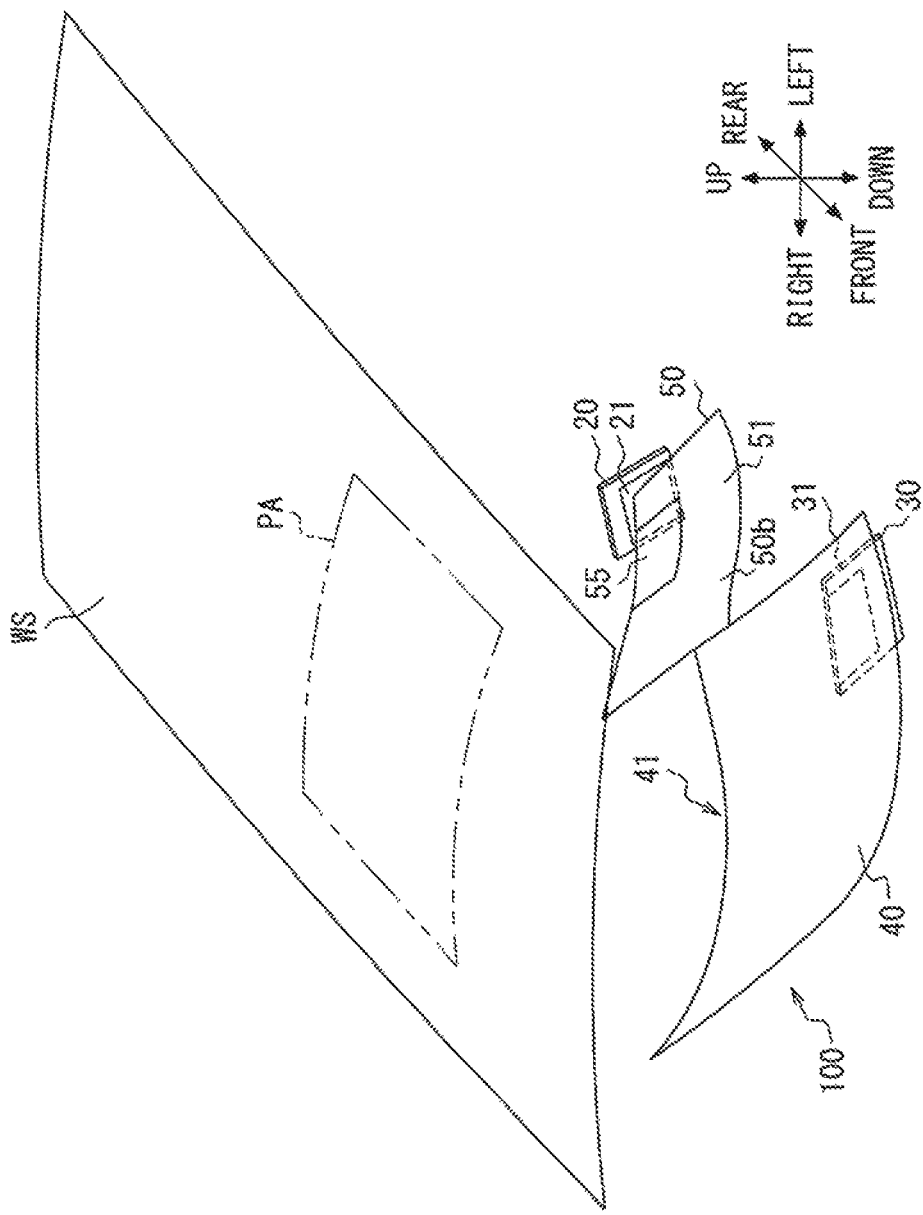
FIG. 3 is a perspective view illustrating a detailed positional relationship of an optical system of the HUD device.
Figure 4:
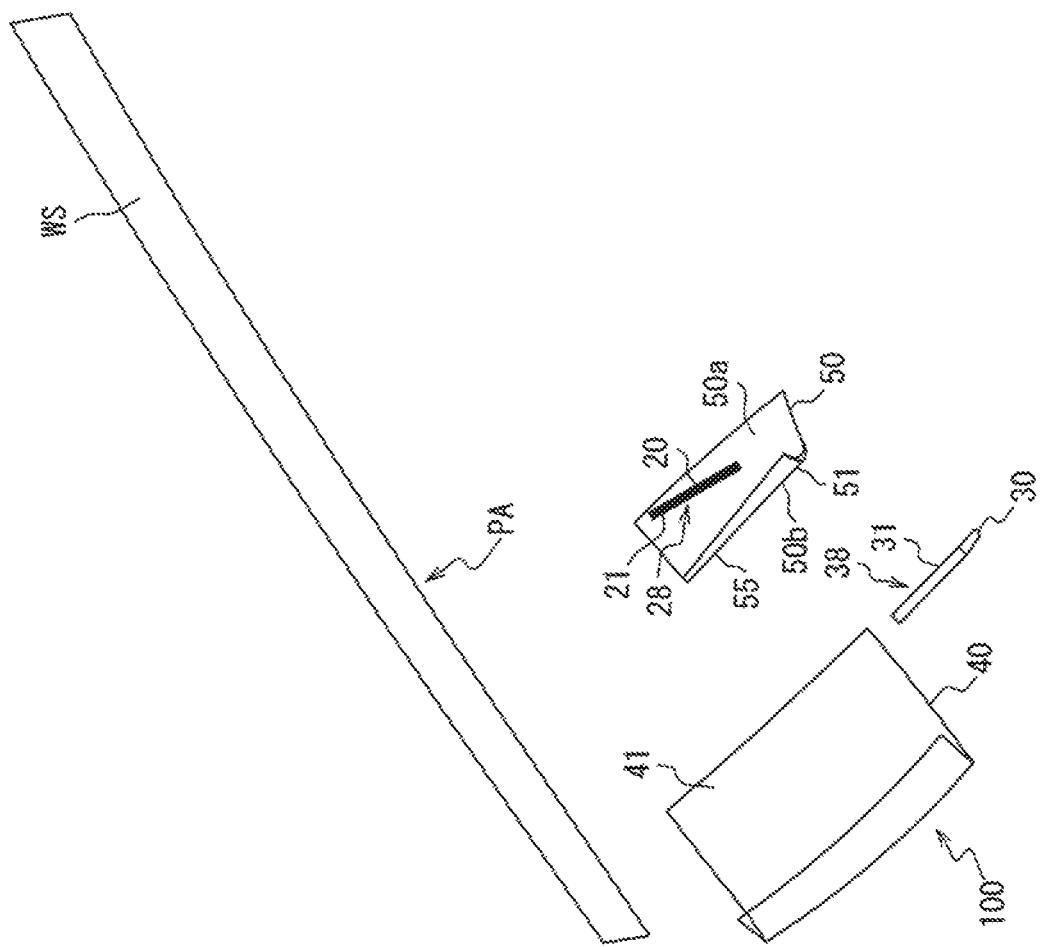
FIG. 4 is a side view illustrating the detailed positional relationship of the optical system of the HUD device.
Figure 5:
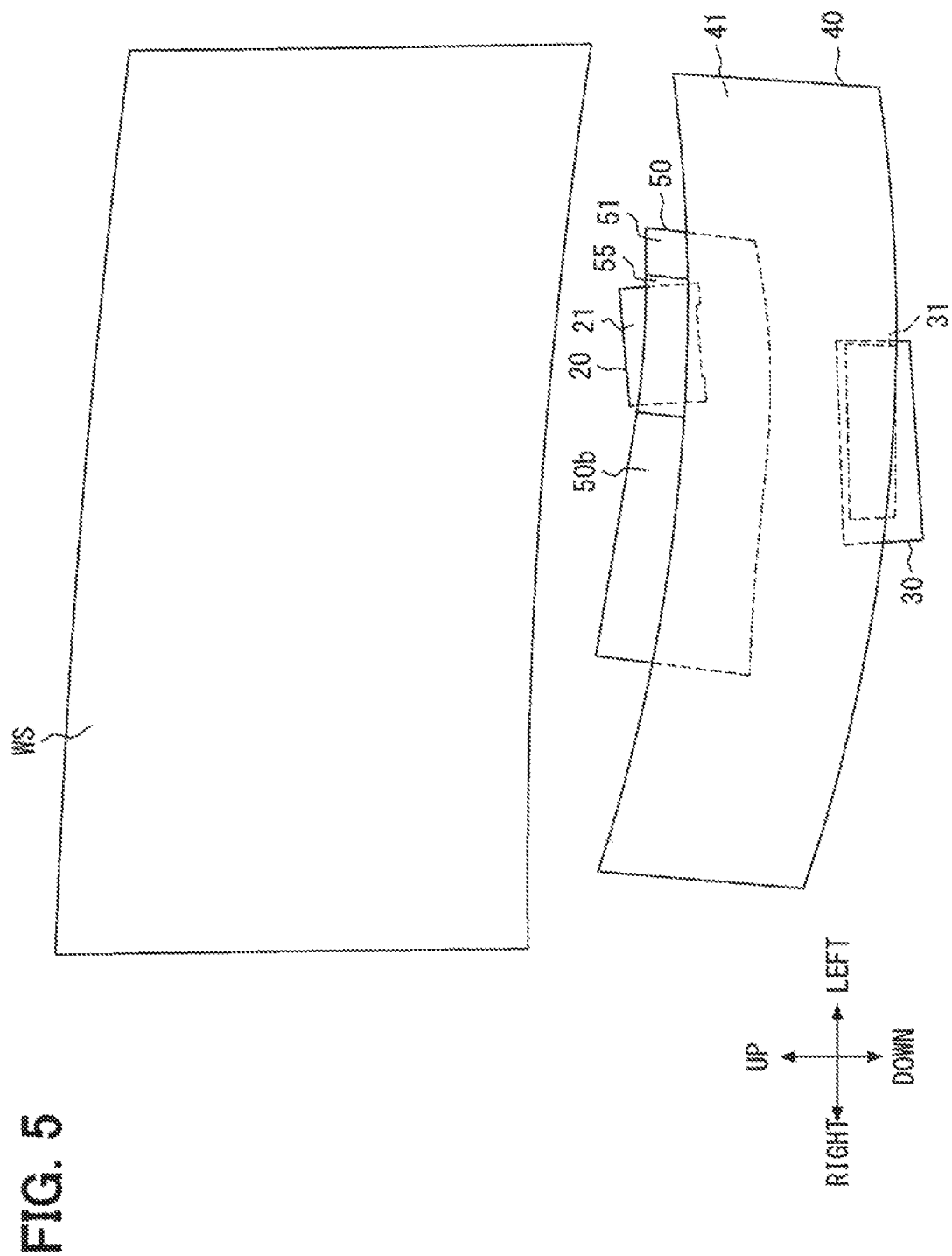
FIG. 5 is a front view illustrating the detailed positional relationship of the optical system of the HUD device.

The passage opening 255 is formed on a part overlapping a near light image optical path LP1 in the extension optical element 250 as with the transmission part 55 (refer to FIG. 3). The passage opening 255 transmits light of a near display image 28. The passage opening 255 is formed in a range facing a first display surface 21 in the extension optical element 250. The passage opening 255 is formed in a horizontally-long rectangular shape as with the first display surface 21. The open area of the passage opening 255 is larger than the area of the first display surface 21 so as not to block light of the near display image 28. The passage opening 255 is formed continuously with the extension reflective surface 51 on a front face 50b of the extension optical element 250. The extension reflective surface 51 borders on at least a range of half or more of the peripheral edge of the passage opening 255. Specifically, a long side and two short sides of the passage opening 255 are in contact with the extension reflective surface 51.

In the extension optical element 250, three end faces 257 which border on the passage opening 255 are inclined in a direction expanding the passage opening 255. Each of the end faces 257 is inclined to expand the passage opening 255 from the front face 50b toward a back face 50a along a thickness direction TD of the extension optical element 250. The inclination angle of the end face 257 with respect to the extension reflective surface 51 is defined so that the driver D whose eye point is located at the eye box EB cannot see the end face 257. Specifically, the taper angle of the end face 257 is set so that external light reflected by a magnifying reflective surface 41 is not directly incident on the end face 257 (refer to FIG. 9).

The extension optical element 250 may be formed by depositing metal such as aluminum on an odd-form resin base having a recess at a position corresponding to the passage opening 255. Alternatively, the extension optical element 250 may be formed by removal processing for removing a range corresponding to the passage opening 255 in a reflecting mirror formed in a curved rectangular shape.

The configuration as described in the second embodiment in which the extension optical element 250 is provided with the passage opening 255 which transmits light of the near display image 28 also makes it possible to achieve effects similar to the effects of the first embodiment and bring the near light image optical path LP1 and the far light image optical path LP2 close to each other. In addition, when the extension reflective surface 51 and the passage opening 255 are separately provided in the extension optical element 250, high reflectance of the extension reflective surface 51 can be ensured. According to the above configuration, the most part of light of the far display image 38 and the most part of light of the near display image 28 can be projected on the projection area PA. Thus, it is possible to ensure sufficient brightness of each of the virtual images 29, 39 while preventing upsizing.

In addition, in the disposition as described in the second embodiment in which the extension reflective surface 51 and the passage opening 255 are closely disposed, even when the extension reflective surface 51 and the passage opening 255 are separately provided, the near virtual image 29 and the far virtual image 39 are displayed at positions close to each other on visual recognition of the driver D. The above configuration makes it easy to expand the displayable area of each of the near virtual image 29 and the far virtual image 39. Thus, high flexibility of virtual image display is ensured.

When the end face 257 which borders on the passage opening 255 is inclined with respect to the thickness direction TD as described in the second embodiment, light reflected by the end face 257 is less likely to be formed as a virtual image visually recognizable by the driver D. Further, according to the inclination shape of the end face 257 in which the passage opening 255 expands toward the back face 50a, external light that has entered the HUD device 200 is less likely to be reflected toward the magnifying optical element 40 by the end face 257. Thus, a deterioration in the display quality is prevented, which is caused by the external light reflected by the end face 257 formed as a virtual image visually recognizable by the driver D.

Third Embodiment

Figure 10:
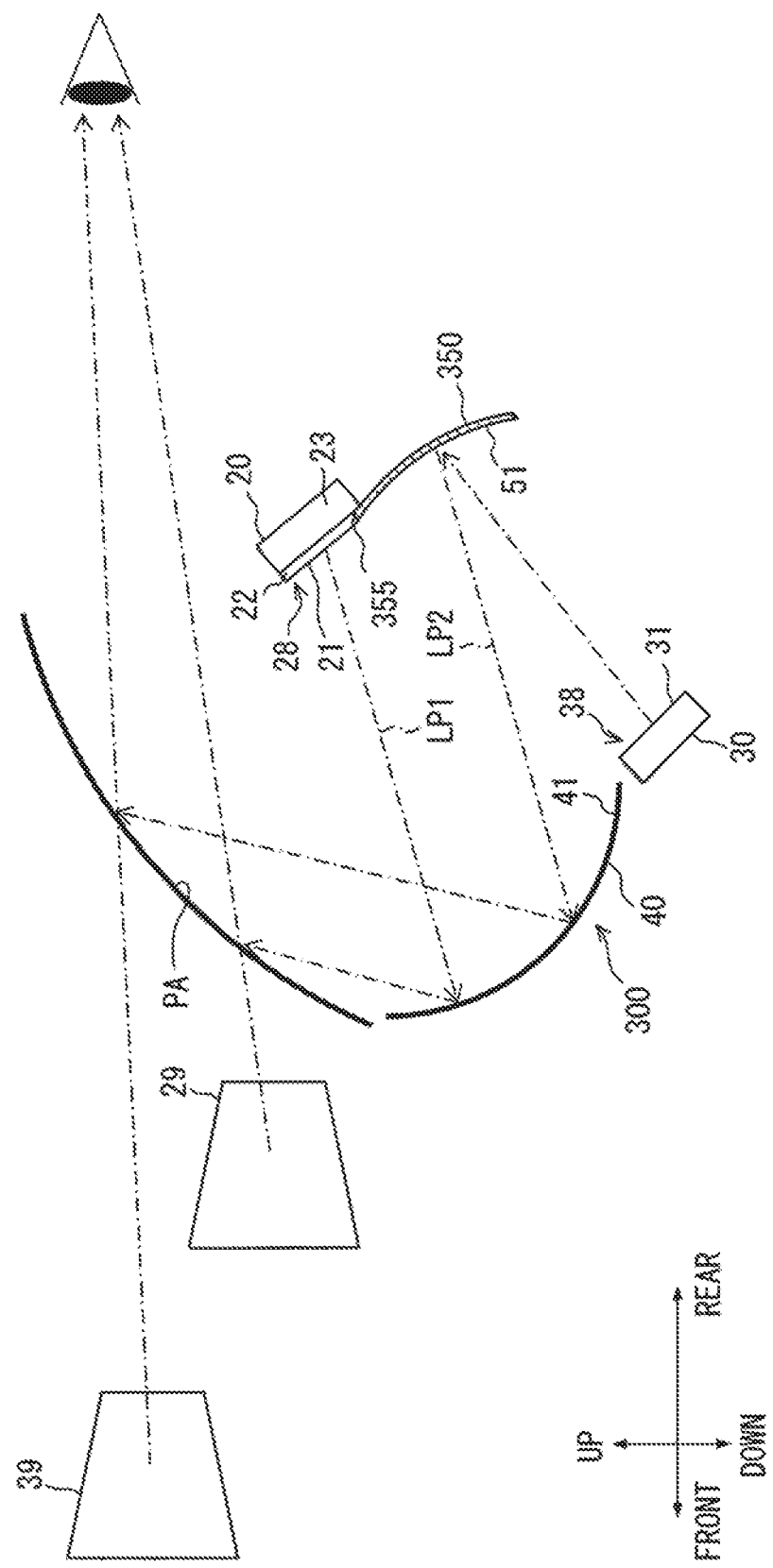
FIG. 10 is a diagram schematically illustrating the configuration of an HUD device according to a third embodiment.
Figure 11:
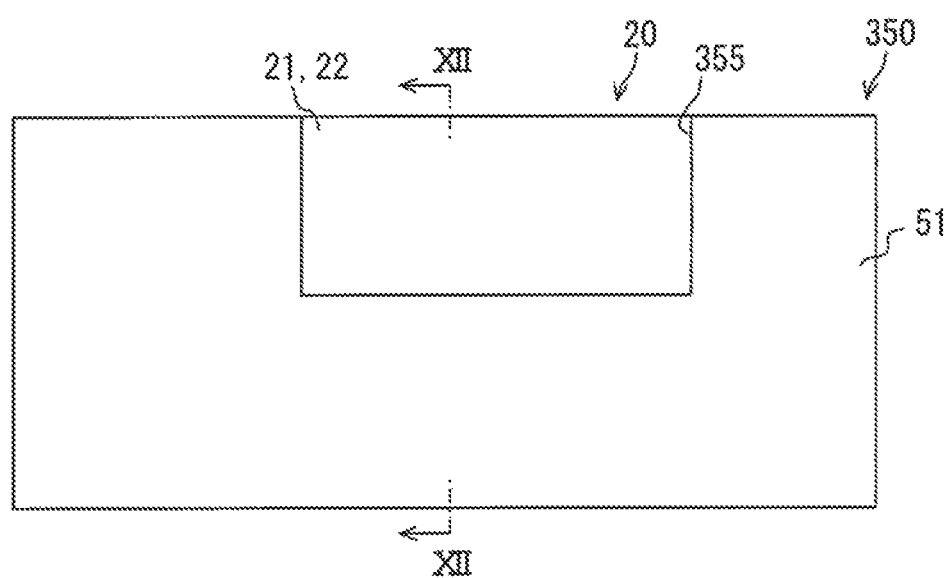
FIG. 11 is a diagram illustrating an extension optical element and a first display device of the third embodiment.
Figure 12:
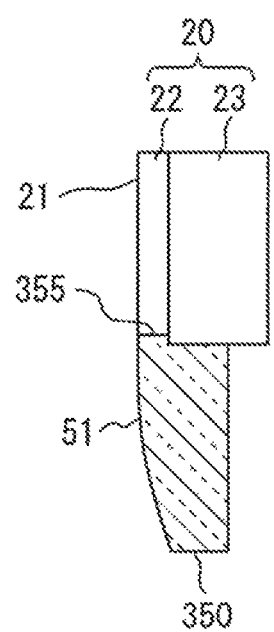
FIG. 12 is a cross-sectional view of the extension optical element and the first display device taken along line XII-XII of FIG. 11.
Figure 13:
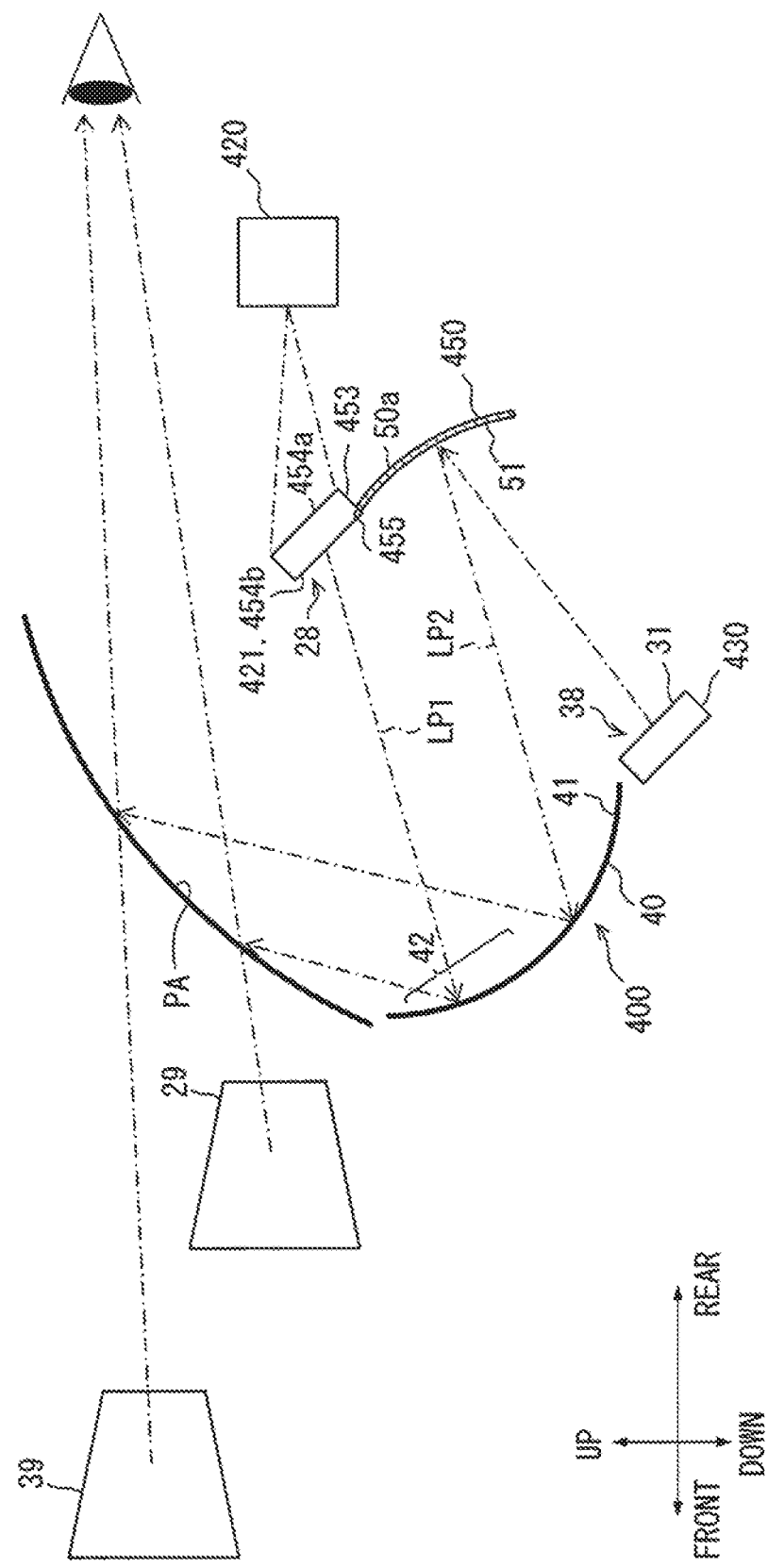
FIG. 13 is a diagram schematically illustrating the configuration of an HUD device according to a fourth embodiment.
Figure 14:
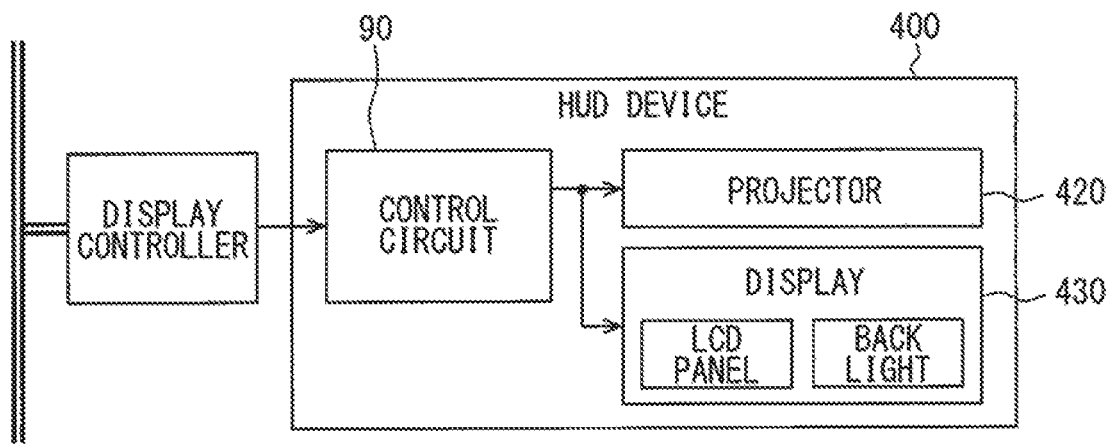
FIG. 14 is a block diagram illustrating the electrical configuration of the HUD device of the fourth embodiment.

A third embodiment of the present disclosure illustrated in FIGS. 10 to 12 is a modification of the second embodiment. In an HUD device 300 of the third embodiment, an extension optical element 350 and a first display device 20 are integrated together. A liquid crystal display panel 22 and a backlight 23 of the first display device 20 are held by the extension optical element 350. A first display surface 21 is embedded in an attachment opening 355 which corresponds to the passage opening 255 (refer to FIG. 8) of the second embodiment (refer to FIG. 11 and the like). The first display surface 21 is directed in the same direction as an extension reflective surface 51 and faces a magnifying reflective surface 41 of a magnifying optical element 40. The first display surface 21 and a principal area of the extension reflective surface 51 are disposed side by side in the up-down direction. The extension reflective surface 51 borders on a long side and two short sides of the first display surface 21.

The configuration as described in the third embodiment in which the extension reflective surface 51 and the first display surface 21 are disposed side by side also makes it possible to bring a near light image optical path LP1 and a far light image optical path LP2 close to each other. Further, light of a near display image 28 emitted from the first display surface 21 is projected on a projection area PA without being blocked by the extension optical element 350. In addition, since the extension reflective surface 51 is provided separately from the first display surface 21, it is easy to increase the reflectance of the extension reflective surface 51. Thus, the most part of light of the far display image 38 can also be projected on the projection area PA. Thus, it is possible to ensure sufficient brightness of each of the virtual images 29, 39 while preventing upsizing.

In addition, in the third embodiment, since the extension optical element 350 is integrated with the first display device 20, these components can be housed in a casing of the HUD device 300 in a compact manner. Thus, the configuration in which the extension optical element 350 and the first display device 20 are integrated together can further contribute to the prevention of upsizing of the HUD device 300. In the third embodiment, the first display device 20 corresponds to the "image display device".

Fourth Embodiment

A fourth embodiment of the present disclosure illustrated in FIGS. 13 to 16 is a modification of the third embodiment. In an HUD device 400 of the fourth embodiment, an extension optical element 450 is integrated with a screen member 453. The HUD device 400 is provided with a projector 420 in addition to a display device 430 which is substantially the same as the second display device 30 (refer to FIG. 10).

Figure 15:
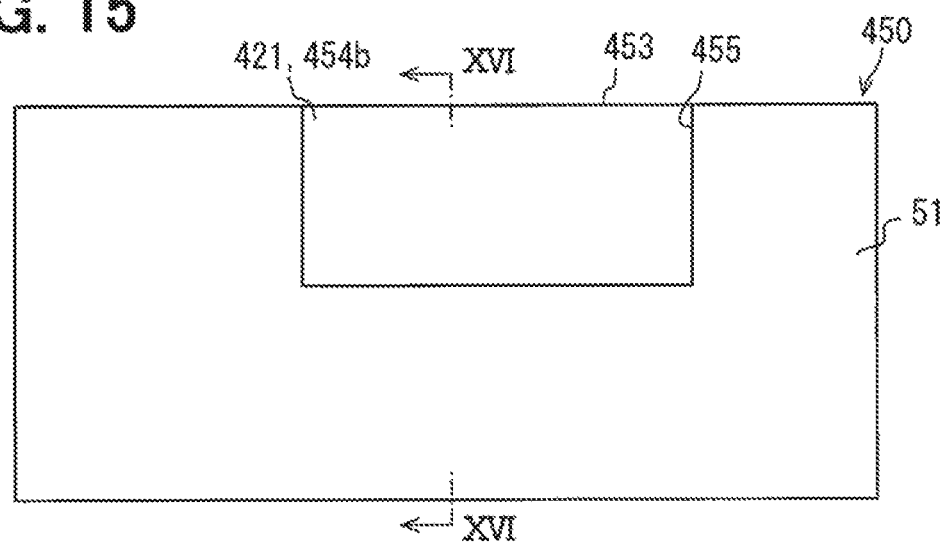
FIG. 15 is a diagram illustrating an extension optical element and a screen member of the fourth embodiment.
Figure 16:
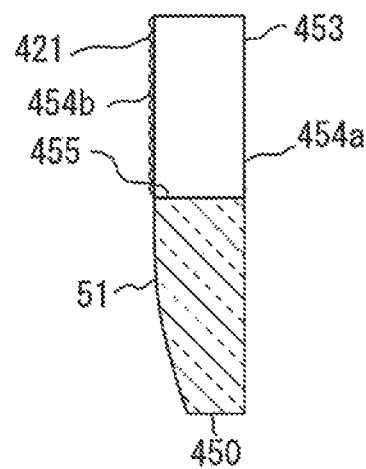
FIG. 16 is a cross-sectional view of the extension optical element and the screen member taken along line XVI-XVI of FIG. 15.

An attachment opening 455 is formed on the extension optical element 450 (refer to FIG. 15 and the like). The screen member 453 is embedded in the attachment opening 455. The screen member 453 is made of a colorless and transparent material such as glass and formed in a plate-like shape having the same size at the attachment opening 455. The attachment opening 455 and the screen member 453 both have a horizontally-long rectangular shape. The respective faces of the screen member 453 serve as an incident surface 454a and an emission surface 454b.

The incident surface 454a is directed in the same direction as a back face 50a of the extension optical element 450. The incident surface 454a is formed in a flat planar shape. The emission surface 454b is directed in the same direction as an extension reflective surface 51. Many micro lenses are arrayed in the emission surface 454b. The emission surface 454b includes a micro lens array (MLA). The emission surface 454b forms a first display surface 421. The first display surface 421 faces a magnifying reflective surface 41 of a magnifying optical element 40. A long side and two short sides of the first display surface 421 are in contact with the extension reflective surface 51. The first display surface 421 functions as a transmissive screen.

The projector 420 renders a near display image 28 on the first display surface 421 with light projected toward the first display surface 421. As an example, the projector 420 is a laser projector which performs scanning with laser light in two-dimensional directions using a micro electro mechanical systems (MEMS) scanner. Rendering of the near display image 28 by the projector 420 is controlled by a control circuit 90 (refer to FIG. 14) together with rendering of a far display image 38 on a second display surface 31. The projector 420 is disposed at the side opposite to a first incident area 42 across the first display surface 421. The projector 420 causes laser light to enter the incident surface 454a of the screen member 453 from the back face 50a of the extension optical element 450. The near display image 28 is luminously displayed on the first display surface 421 by laser light transmitting through the screen member 453. As described above, the first display surface 421 functions as a transmissive screen.

The fourth embodiment described above also achieves effects similar to the effects of the third embodiment, and the most part of light of each of the near display image 28 and the far display image 38 can be projected on a projection area PA. Thus, it is possible to ensure sufficient brightness of each of the virtual images 29, 39 while preventing upsizing by the disposition in which a near light image optical path LP1 and a far light image optical path LP2 are close to each other.

The screen member 453 may be a holographic diffuser or a diffuser panel. The projector 420 is not limited to a laser projector. For example, the projector 420 may have a digital light processing (DLP, registered trademark) configuration which includes a digital micro device (DMD) including many micro mirrors and a projection light source which projects light toward the DMD. Alternatively, a liquid crystal display (LCD) configuration which combines a liquid crystal display with a projection light source may be used as the projector 420.

Fifth Embodiment

Figure 17:
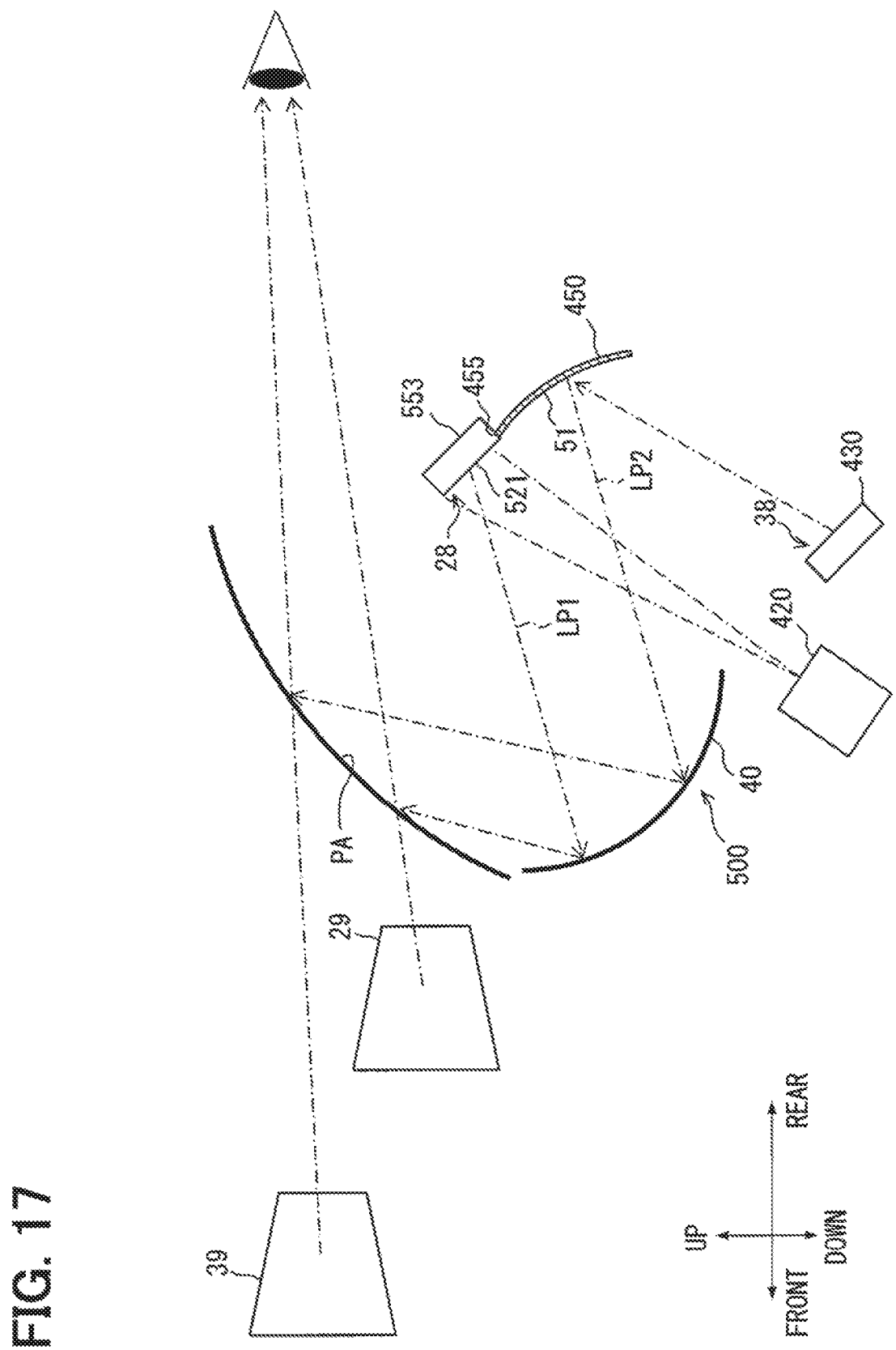
FIG. 17 is a diagram schematically illustrating the configuration of an HUD device according to a fifth embodiment.

A fifth embodiment of the present disclosure illustrated in FIG. 17 is a modification of the fourth embodiment. In an HUD device 500 of the fifth embodiment, a screen member 553 is fitted in an attachment opening 455 of an extension optical element 450. In both faces of the screen member 553, one face which is directed in the same direction as an extension reflective surface 51 is a reflective surface and forms a first display surface 521. Many micro mirrors are arrayed on the first display surface 521. The first display surface 521 includes a micro mirror array (MMA).

A projector 420 of the fifth embodiment is disposed below a magnifying optical element 40. The projector 420 applies laser light toward the first display surface 521 of the screen member 553 located above from a position between the magnifying optical element 40 and a display device 430 which are disposed side by side in the up-down direction. Laser light that has arrived at the first display surface 521 is reflected by each of the micro mirrors so that a near display image 28 is luminously displayed on the first display surface 521. As described above, the first display surface 521 functions as a reflective screen.

The fifth embodiment described above also achieves effects similar to the effects of the fourth embodiment, and the most part of light of each of the near display image 28 and the far display image 38 can be projected on a projection area PA. Thus, it is possible to ensure sufficient brightness of each of the virtual images 29, 39 while preventing upsizing by the close disposition of a near light image optical path LP1 and a far light image optical path LP2.

Other Embodiment

The present disclosure is not limited to the above-mentioned embodiments, and may have various modifications and combinations thereof without departing from the gist of the present disclosure.

Figure 18:
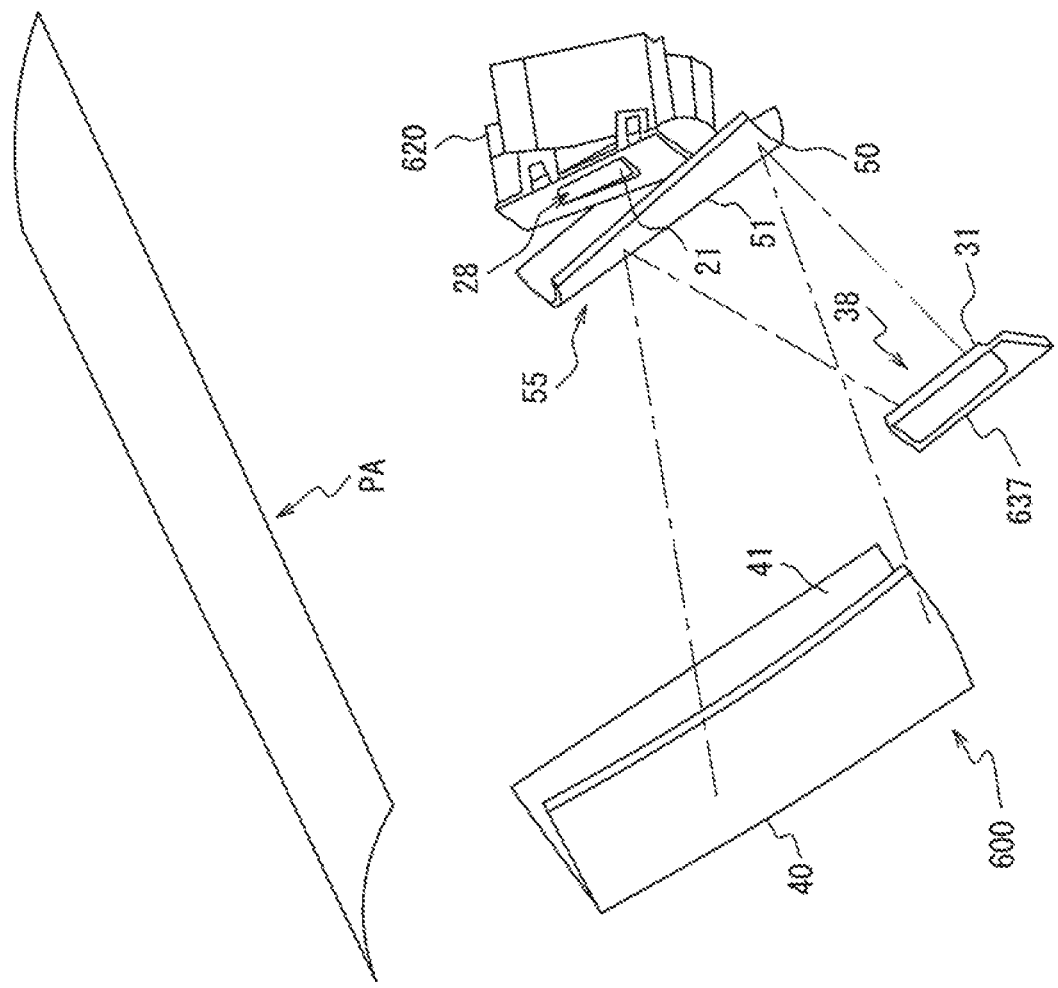
FIG. 18 is a diagram schematically illustrating the configuration of an optical system of an HUD device of a first modification.
Figure 19:
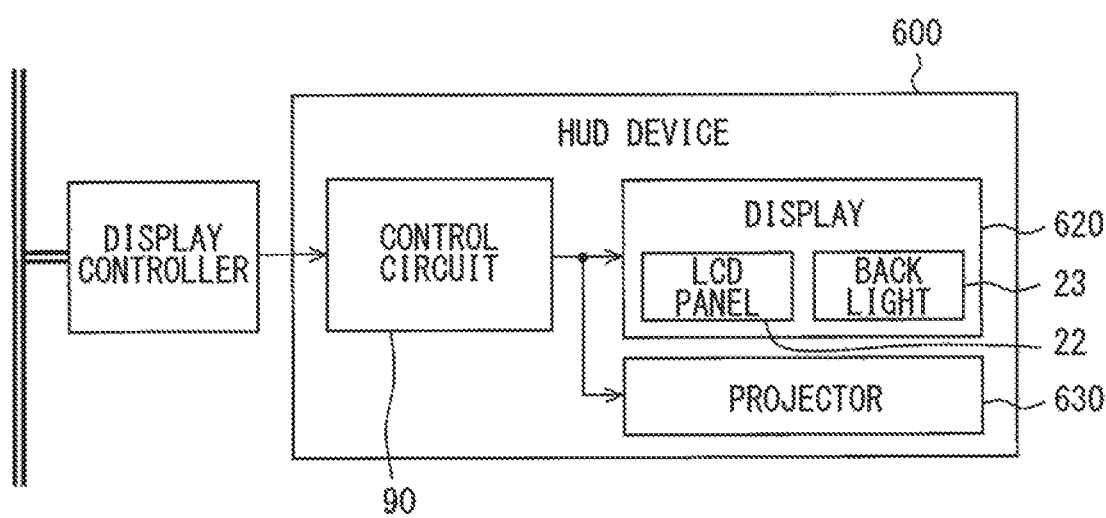
FIG. 19 is a block diagram illustrating the electrical configuration of the HUD device of the first modification.

As illustrated in FIGS. 18 and 19, an HUD device 600 according to a first modification of the first embodiment is provided with a projector 630 and a screen member 637 as configurations for luminously displaying the far display image 38 in addition to a display device 620. The display device 620 has substantially the same configuration as the first display device 20 (refer to FIG. 1) of the first embodiment, and luminously displays the near display image 28 on the first display surface 21.

The projector 630 is a laser projector which performs scanning with laser light in two-dimensional directions using a micro electro mechanism systems (MEMS) scanner as with the projector 420 (refer to FIG. 13) of the fourth embodiment. Rendering of the far display image 38 by the projector 630 is controlled by the control circuit 90 together with rendering of the near display image 28 on the first display surface 21.

The screen member 637 is made of a colorless and transparent material such as glass and formed in a horizontally-long rectangular plate-like shape as with the screen member 553 (refer to FIG. 17) of the fifth embodiment. The screen member 637 forms a second display surface 31 as a reflective surface which functions as a reflective screen. The screen member 637 includes a micro mirror array (MMA), and the reflective surface on which many micro mirrors are arrayed serves as the second display surface 31. The screen member 637 is disposed below the magnifying optical element 40. The screen member 637 is held by the housing of the HUD device 600 in a manner that the second display surface 31 faces the extension reflective surface 51.

Figure 20:
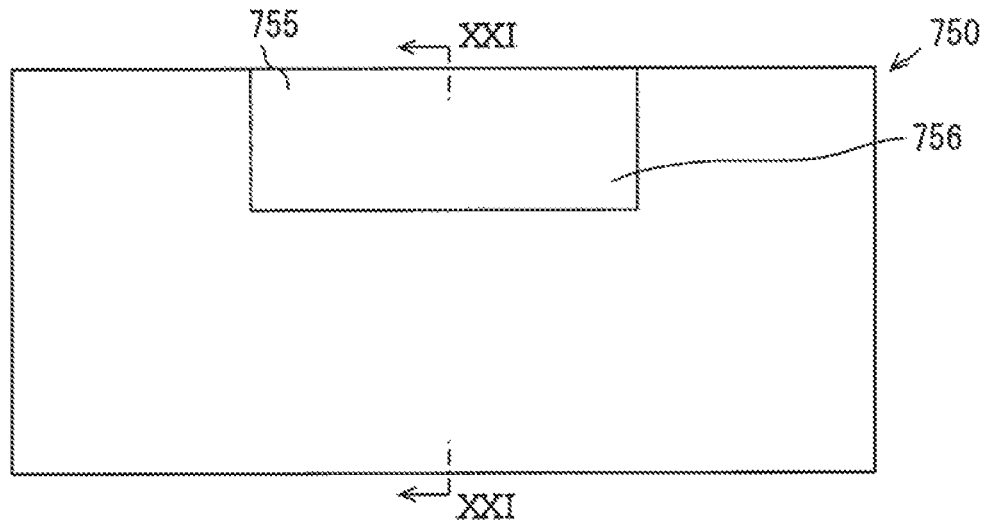
FIG. 20 is a diagram illustrating an extension optical element according to a second modification.
Figure 21:
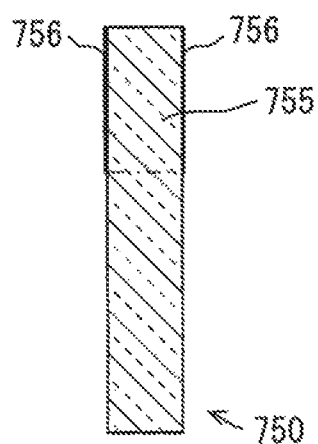
FIG. 21 is a cross-sectional view of the second modification taken along line XXI-XXI of FIG. 20.

In a second modification of the first embodiment, as illustrated in FIGS. 20 and 21, a transmission part 755 is not offset to one side in the longitudinal direction of an extension optical element 750, but disposed on substantially the center thereof. In this manner, the position at which the transmission part is formed on the extension optical element and the shape of the transmission part can be appropriately changed.

In addition, in the first modification, coat layers 756 are formed on both faces of the transmission part 755. Each of the coat layers 756 is formed of, for example, a polarizing film having a polarizing characteristic. The polarizing film is capable of blocking the most part of external light reflected by the magnifying reflective surface. As a result, the transmittance of near infrared light in the transmission part 755 is reduced. As a result, concentration of sunlight onto the first display device is prevented.

For example, the coat layer may be formed only on the front face of the transmission part. Further, when an adverse effect of external light on the first display device is a little, the coat layer may be omitted. In such a mode, the transmittance of near infrared light in the transmission part is equal to the transmittance of visible light or slightly higher than the transmittance of visible light. The transmittance of the transmission part is desirably 90% or more. However, in a mode in which coat layers are formed on both faces, the transmittance of the transmission part may be less than 90%.

Figure 22:
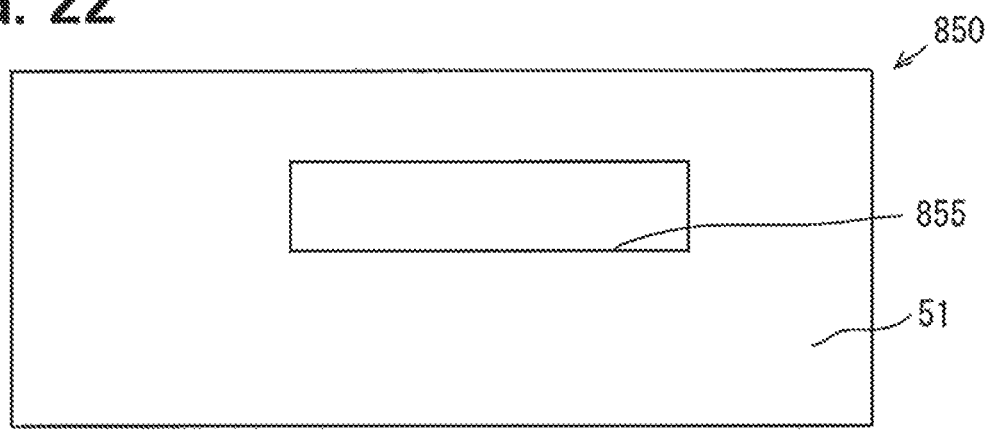
FIG. 22 is a diagram illustrating an extension optical element according to a third modification.

In the second modification of the second embodiment, as illustrated in FIG. 22, a passage opening 855 is open on substantially the center of an extension optical element 850. An extension reflective surface 51 surrounds the peripheral edge of the passage opening 855 over the entire circumference thereof. According to the extension optical element 850 of the second modification, a near light image optical path and a far light image optical path intersect each other in a space. Also in such optical path setting, when the passage opening 855 and the extension reflective surface 51 are separately formed, the most part of light of each display image is projected on the windshield and visually recognized as a virtual image having high brightness.

In the configuration as described in the second modification in which the passage opening is formed, an end face surrounding the passage opening may be formed substantially perpendicular to the extension reflective surface. Alternatively, the end face may be inclined in the direction expanding the passage opening from the back face toward the front face along the thickness direction of the extension optical element. Further, black coating which lowers the light reflectance may be applied onto each end face.

In the above embodiments, only one transmission part or one passage opening is formed on the extension optical element. However, plural transmission parts or plural passage openings may be formed on the extension optical element. The shape of the transmission part or the passage opening may be appropriately changed, and may be a triangular shape, a sector shape, or a square shape. Plural display screens or plural first display surfaces as screens may be disposed on the extension optical element adjacently to the extension reflective surface.

In the above first embodiment and the like, the display device which includes the liquid crystal display panel and the backlight in combination is employed as the configuration that luminously displays each display image. However, the configuration of each display device may be appropriately changed. For example, a display device which uses organic electroluminescence (EL) may luminously display each display image. Further, both the first display surface and the second display surface may be screens on which display images are rendered by the projector.

In the above embodiments, the HUD device is a bifocal HUD which forms virtual images on two different focal points. However, the HUD device may be a multifocal HUD which forms virtual images on three or more focal points by projecting light of three or more display images on a projection area.

In the above embodiments, each display image is displayed in color. However, the display image and the virtual image may be luminously displayed in a single color. The size of the display image and the virtual image may be appropriately changed. The range in which each virtual image can be displayed may be vertically long. In addition, the image formation position and the orientation of the far virtual image and the near virtual image may be appropriately changed.

The configuration of the optical system used in the HUD device may be appropriately changed. For example, each of the number of magnifying optical elements and the number of extension optical elements does not have to be one. The number of reflecting mirrors included in the HUD device may be appropriately changed. For example, plural magnifying optical elements may be disposed on each optical path. Further, the extension optical element may be disposed between the magnifying optical element and the projection area on the optical path of light of the far display image. A reflecting mirror or a lens which exhibits an optical action different from the optical actions of the magnifying optical element and the extension optical element may be disposed on the near light image optical path. The first incident area and the second incident area which are defined on the magnifying reflective surface may be separated from each other.

The curved shape of the magnifying reflective surface and the extension reflective surface may be appropriately changed so that an effective correction action is exhibited. Each reflective surface desirably has a free-form surface shape for maximizing a correction action. However, each reflective surface may have a toroidal shape or a cylindrical shape in view of reducing the manufacturing cost as long as a sufficient correction action can be exhibited.

The movable body on which the HUD device is mounted may be a movable body other than a vehicle, such as a ship, an airplane, or a transport machine. In addition, an occupant of the movable body may not be a driver who operates the movable body. The projection member on which light of the display image is projected by the HUD device is not limited to the windshield, and may be a combiner which is disposed above a meter hood.

The configuration disclosed above contributes not only to the above effects such as the prevention of upsizing and the ensuring of sufficient brightness of each virtual image, but also to improvement of various performances relating to the HUD device. For example, the configuration of the present disclosure can contribute to improvement of the display quality (the expressive power and the flexibility) of each virtual image, improvement of tracking of color and position to an object of AR display, expansion of a visual field, power saving, weight reduction, cost reduction, and improvement of formability and assembly easiness during manufacture. Further, the configuration of the present disclosure can also contribute to improvement of the workability during a mounting operation to a vehicle, the maintainability after mounting, the heat resistance to sunlight, the durability to vibrations and impact of a vehicle, and a dustproof property. The configuration of the present disclosure is also capable of exhibiting the effects as described above in a compatible manner.

What is claimed is:

1. A head-up display device that projects two display images on a projection member to display virtual images of the two display images formed at different positions visually recognizably by a viewer, the head-up display device comprising:
   a first display surface that luminously displays, among the two display images, a near display image to be formed as a near virtual image at a position closer to the projection member;
   a second display surface that luminously displays, among the two display images, a far display image to be formed as a far virtual image at a position farther from the projection member than the near virtual image is; and
   an extension optical element that includes a reflective surface disposed on an optical path of light of the far display image to reflect light of the far display image, the extension optical element making a far optical path distance from the second display surface to the projection member longer than a near optical path distance from the first display surface to the projection member by reflection of light by the reflective surface, wherein
   the extension optical element has a transmission part that transmits light of the near display image in an area overlapping an optical path of light of the near display image, and
   the reflective surface and the transmission part are separately provided along the extension optical element.

2. The head-up display device according to claim 1, wherein the reflective surface borders on at least a range of half or more of a peripheral edge of the transmission part.

3. The head-up display device according to claim 1, wherein a transmittance of light in a near infrared range in the transmission part is defined lower than a transmittance of light in a visible range in the transmission part.

4. The head-up display device according to claim 1, further comprising: a magnifying optical element that reflects light emitted from the first display surface and the second display surface toward the projection member while spreading the light so that the near virtual image and the far virtual image are magnified from the near display image and the far display image, respectively, wherein
   the extension optical element is disposed closer to the first display surface than the magnifying optical element is.

5. The head-up display device according to claim 4, wherein at least a part of a first incident area of the magnifying optical element where light of the near display image enters overlaps at least a part of a second incident area of the magnifying optical element where light of the far display image reflected by the reflective surface enters.

6. The head-up display device according to claim 1, wherein
   the transmission part is formed continuously with the reflective surface on a front face of the extension optical element.

7. A head-up display device that projects two display images on a projection member to display virtual images of the two display images formed at different positions visually recognizably by a viewer, the head-up display device comprising:
   a first display surface that luminously displays, among the two display images, a near display image to be formed as a near virtual image at a position closer to the projection member;
   a second display surface that luminously displays, among the two display images, a far display image to be formed as a far virtual image at a position farther from the projection member than the near virtual image is; and
   an extension optical element that includes a reflective surface disposed on an optical path of light of the far display image to reflect light of the far display image, the extension optical element making a far optical path distance from the second display surface to the projection member longer than a near optical path distance from the first display surface to the projection member by reflection of light by the reflective surface, wherein the extension optical element has a passage opening that allows light of the near display image to pass through, and the reflective surface and the passage opening are separately provided along the extension optical element.

8. The head-up display device according to claim 7, wherein the reflective surface borders on at least a range of half or more of a peripheral edge of the passage opening.

9. The head-up display device according to claim 7, wherein the extension optical element is formed in a plate-like shape, and an end face of the extension optical element bordering on the passage opening is inclined in a direction expanding the passage opening.

10. The head-up display device according to claim 9, wherein one face of the extension optical element on which the reflective surface is formed is defined as a front face, and the other face of the extension optical element where light of the near display image enters is defined as a back face, the end face is inclined in the direction expanding the passage opening from the front face toward the back face along a thickness direction of the extension optical element.

11. The head-up display device according to claim 7, wherein the passage opening is formed continuously with the reflective surface on a front face of the extension optical element.

12. A head-up display device that projects two display images on a projection member to display virtual images of the two display images formed at different positions visually recognizably by a viewer, the head-up display device comprising:

a first display surface that luminously displays, among the two display images, a near display image to be formed as a near virtual image at a position closer to the projection member;

a second display surface that luminously displays, among the two display images, a far display image to be formed as a far virtual image at a position farther from the projection member than the near virtual image is;

an extension optical element that includes a reflective surface disposed on an optical path of light of the far display image to reflect light of the far display image, the extension optical element making a far optical path distance from the second display surface to the projection member longer than a near optical path distance from the first display surface to the projection member by reflection of light by the reflective surface; and a projector that renders the near display image on the first display surface with light projected toward the first display surface, wherein the first display surface is integrally formed with the extension optical element and disposed side by side with the reflective surface.

13. The head-up display device according to claim 12, wherein the reflective surface borders on at least a range of half or more of a peripheral edge of the first display surface.

14. The head-up display device according to claim 12, further comprising: a magnifying optical element that reflects light emitted from the first display surface and the second display surface toward the projection member while spreading the light so that the near virtual image and the far virtual image are magnified from the near display image and the far display image, respectively.

15. A head-up display device that projects two display images on a projection member to display virtual images of the two display images formed at different positions visually recognizably by a viewer, the head-up display device comprising:

a first display surface that luminously displays, among the two display images, a near display image to be formed as a near virtual image at a position closer to the projection member;

a second display surface that luminously displays, among the two display images, a far display image to be formed as a far virtual image at a position farther from the projection member than the near virtual image is;

an extension optical element that includes a reflective surface disposed on an optical path of light of the far display image to reflect light of the far display image, the extension optical element making a far optical path distance from the second display surface to the projection member longer than a near optical path distance from the first display surface to the projection member by reflection of light by the reflective surface; and a magnifying optical element that reflects light emitted from the first display surface and the second display surface toward the projection member while spreading the light so that the near virtual image and the far virtual image are magnified from the near display image and the far display image, respectively, wherein the first display surface is integrally formed with the extension optical element and disposed side by side with the reflective surface.

16. The head-up display device according to claim 15, wherein the extension optical element is integrally formed with an image display device that luminously displays the near display image on the first display surface.

17. The head-up display device according to claim 15, wherein the reflective surface borders on at least a range of half or more of a peripheral edge of the first display surface.

* * * * *